(12) United States Patent
Nonaka

(10) Patent No.: US 6,781,238 B2
(45) Date of Patent: Aug. 24, 2004

(54) SEMICONDUCTOR DEVICE AND METHOD OF FABRICATING THE SAME

(75) Inventor: Makoto Nonaka, Tokyo (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 09/823,752

(22) Filed: Apr. 3, 2001

(65) Prior Publication Data

US 2001/0035555 A1 Nov. 1, 2001

(30) Foreign Application Priority Data

Apr. 3, 2000 (JP) .................................. 2000-100732

(51) Int. Cl.[7] .............................................. H01L 23/48
(52) U.S. Cl. ..................... 257/773; 257/774; 257/775; 257/786
(58) Field of Search ................................ 257/758, 773, 257/774, 775, 786

(56) References Cited

U.S. PATENT DOCUMENTS

| | | | | |
|---|---|---|---|---|
| 4,949,150 A | * | 8/1990 | Giannella | 257/535 |
| 5,148,263 A | * | 9/1992 | Hamai | 257/758 |
| 5,309,015 A | * | 5/1994 | Kuwata et al. | 257/659 |
| 5,394,013 A | * | 2/1995 | Oku et al. | 257/786 |
| 5,466,956 A | * | 11/1995 | Aeba | 257/203 |
| 5,594,279 A | * | 1/1997 | Itou et al. | 257/758 |
| 5,751,065 A | * | 5/1998 | Chittipeddie et al. | 257/758 |
| 5,903,031 A | * | 5/1999 | Yamada et al. | 257/356 |
| 5,949,098 A | * | 9/1999 | Mori | 257/211 |
| 6,020,643 A | * | 2/2000 | Fukuzumi et al. | 257/774 |

FOREIGN PATENT DOCUMENTS

| | | | |
|---|---|---|---|
| EP | 0 637 840 A1 | 2/1995 | |
| JP | 59-23541 | 2/1984 | |
| JP | 61-248540 | 11/1986 | |
| JP | 61-263251 | 11/1986 | |
| JP | 1-109746 | 4/1989 | |
| JP | 4-2-117138 | * 5/1990 | ................. 257/173 |
| JP | 4-116851 | 4/1992 | |
| JP | 5-55380 | 3/1993 | |
| JP | 9-307067 | 11/1997 | |
| JP | 10-313095 | 11/1998 | |
| JP | 11-307724 | 11/1999 | |

OTHER PUBLICATIONS

Machine Translation of JP 11–307724 (japanese reference provided by applicant).*

* cited by examiner

Primary Examiner—George Eckert
(74) Attorney, Agent, or Firm—Sughrue Mion, PLLC

(57) ABSTRACT

A semiconductor device having a plurality of wiring layers in a multi-layered structure, includes an inner area at a surface and a pad area surrounding the inner area therein, and further includes a device fabricated below the pad area. The device is comprised of at least one of a bypass capacitor, a protection device, and an input/output device. For instance, the bypass capacitor is comprised of metal wire layers arranged below the pad area.

14 Claims, 17 Drawing Sheets

DEVICE 31 IS FORMED
BELOW PAD 15a

SEMICONDUCTOR DEVICE AND METHOD OF FABRICATING THE SAME

BACKGROUND OF THE INVENTION

1. Field of the Invention

The invention relates to a semiconductor device and a method of fabricating the same, and more particularly to a semiconductor device having a plurality of wiring layers in a multi-layered structure by which a bypass capacitor is defined, and a method of fabricating the same.

2. Description of the Related Art

There has been known a large scaled integrated circuit (LSI) chip as a semiconductor device including a plurality of wiring layers in a multi-layered structure, and including an inner area centrally at a surface and a pad area around the inner area.

FIGS. 1A and 1B illustrate a conventional LSI chip. FIG. 1A is a top plan view of the same, and FIG. 1B is an enlarged view of an area M in FIG. 1A.

As illustrated in FIG. 1A, LSI chip 1 is comprised of an inner area 2 located centrally at a surface of LSI chip 1, an input/output area 3 located around the inner area 2, and a pad area 4 located around the input/output area 3.

In the input/output area 3, a plurality of input/output terminal 5 is arranged surrounding the inner area 2. In the pad area 4, a plurality of pads 6 is arranged surrounding the input/output area 3.

In the input/output area 3, there are formed a first wire 7 in the form of a square, surrounding the inner area 2, and a second wire 8 in the form of a square, surrounding the first wire 7. The first wire 7 is electrically connected to a voltage source (not illustrated), and the second wire 8 is grounded.

Any wiring layers are not formed below the pads 6 in the pad area 4. This is because if wiring layers are formed below the pads 6, a force may be exerted on the pads 6 in a step of wire-bonding, resulting in that the pads 6 may be damaged.

As illustrated in FIG. 1B, the pads 6 are electrically connected to the input/output terminal 5, the first wire 7 or the second wire 8 through a via contact 9. Hereinbelow, a pad 6 electrically connected to the input/output terminal 5 is called a signal pad 6a, a pad 6 electrically connected to the first wire 7 is called a VDD pad 6b, and a pad 6 electrically connected to the second wire 8 is called a GND pad 6c.

Each of the first and second wires 7 and 8 is comprised of a plurality of metal wire layers in a multi-layered structure in the input/output area 3. In order to ensure to apply a source voltage to a transistor fabricated in the input/output area 3, the first wire 7 is formed just above a p-channel region in an input/output buffer, and the second wire 8 is formed separately from the first wire 7 just above a n-channel region in an input/output buffer.

However, the first and second wires 7 and 8 are not designed to have a structure suitable for defining a bypass capacitor therein for suppressing noises in a power source line to thereby stabilize a voltage. Accordingly, in order to ensure a resistance to such noises and an operation at a high rate, it would be necessary to form quite a lot of the VDD pads 6b and the GND) pads 6c.

This is because, with a size of a chip being smaller and smaller and an operation speed being higher and higher, it becomes more and more difficult for a conventional power source to guarantee a resistance to noises and a radio-frequency characteristic to be in an allowable range. Since it becomes difficult to reduce an impedance in a conventional power source in a chip fabricated smaller and smaller, it would be unavoidable to increase the VDD pads 6b and the GND pads 6c in order to ensure a high speed operation of a chip.

A bypass capacitor is often formed around a chip on a substrate. However, such a bypass capacitor formed on a substrate would be a bar to an increase in a density at which components are mounted on a substrate.

Japanese Unexamined Patent Publication No. 5-55380 has suggested a semiconductor integrated circuit device including a plurality of wiring layers, characterized in that a first wiring layer electrically connected to a voltage source is formed all over at least one of the wiring layers, and that a second wiring layer grounded is formed all over at least one of said wiring layers except the first wiring layer.

Japanese Unexamined Patent Publication No. 9-307067 has suggested a semi-custom semiconductor integrated circuit device including a capacitor formed in a non-used bonding pad area. The capacitor has at least three wiring layers and insulating layers sandwiched between wiring layers. A first voltage is applied to a lower wiring layer, a second voltage is applied to an intermediate wiring layer, and the first voltage or a third voltage is applied to an upper wiring layer.

However, the above-mentioned problems remain unsolved even in those Publications.

SUMMARY OF THE INVENTION

In view of the above-mentioned problems in the conventional semiconductor devices, it is an object of the present invention to provide a semiconductor device which is capable of defining a bypass capacitor without occupying a space to thereby enhance a resistance to noises and a radio-frequency characteristic in a power source line without increasing pads in number.

In one aspect of the present invention, there is provided a semiconductor device having a plurality of wiring layers in a multi-layered structure, the semiconductor device including an inner area at a surface and a pad area surrounding the inner area therein, the semiconductor device including a device fabricated below the pad area.

For instance, the device is comprised of a bypass capacitor, a protection device, or an input/output device alone or in combination.

The semiconductor device may further include a second device fabricated below the device, the device being comprised of a bypass capacitor, the second device being comprised of at least one of a protection device and an input/output device.

It is preferable that the bypass capacitor is comprised of metal wire layers arranged below the pad area.

For instance, each of the metal wire layers may be comprised of a first wire and a second wire with an interlayer insulating layer being sandwiched therebetween, the first wire being electrically connected to a voltage source, the second wire being grounded.

As an alternative, each of the metal wire layers may be comprised of a first comb-shaped wire being electrically connected to a voltage source and a second comb-shaped wire being grounded, the first and second wires being arranged such that teeth of the first comb-shaped wire are located between teeth of the second comb-shaped wire in the same plane.

The semiconductor device may further include at least one of first to fourth pads in the pad area, the first pad being electrically connected to the input/output device, the second pad being electrically connected to the first wire, the third pad being electrically connected to the second wire, the fourth pad being not electrically connected to the input/output device, the first wire and the second wire.

There is further provided a semiconductor device having a plurality of wiring layers in a multi-layered structure, the semiconductor device including an inner area at a surface, an input/output area surrounding the inner area therein, and a pad area surrounding the input/output area therein, the semiconductor device including a plurality of input/output terminals in the input/output area, and a plurality of pads in the pad area, the semiconductor device including (a) a first source voltage wire being electrically connected to a voltage source and surrounding the inner area in the pad area, and (b) a first ground wire being grounded and surrounding the first source voltage wire in the pad area, each of the pads being electrically connected to any one of the input/output terminals, the first source voltage wire, and the first ground wire, the first source voltage wire being comprised of a plurality of first metal wiring layers in a multi-layered structure, the first metal wiring layers being electrically connected to one another through via-holes formed through first interlayer insulating films sandwiched between the first metal wiring layers, the first ground wire being comprised of a plurality of second metal wiring layers in a multi-layered structure, the second metal wing layers being electrically connected to one another through via-holes formed through the first interlayer insulating films, each of the first metal wiring layers and each of the second metal wiring layers being formed in the same layer, vertically adjacent first and second metal wiring layers with one of the first interlayer insulating films being sandwiched therebetween, among the first and second metal wiring layers, defining a bypass capacitor.

It is preferable that the semiconductor device further includes (c) a second source voltage wire being electrically connected to a voltage source and surrounding the inner area in the input/output area, and (d) a second ground wire being grounded and surrounding the second source voltage wire in the input/output area, the second source voltage wire being comprised of a plurality of third metal wiring layers in a multi-layered structure, the third metal wiring layers being electrically connected to one another through via-holes formed through second interlayer insulating films sandwiched between the third metal wiring layers, the second ground wire being comprised of a plurality of fourth metal wiring layers in a multi-layered structure, the fourth metal wiring layers being electrically connected to one another through via-holes formed through the second interlayer insulating films, each of the third metal wiring layers and each of the fourth metal wiring layers being formed in the same layer, vertically adjacent third and fourth metal wiring layers with one of the second interlayer insulating films being sandwiched therebetween, among the third and fourth metal wiring layers, defining a bypass capacitor.

It is preferable that the first source voltage wire is electrically connected to the second source voltage wire, and the first ground wire is electrically connected to the second ground wire.

It is preferable that the first source voltage wire is comprised of a first comb-shaped wire being electrically connected to a voltage source, and the first ground wire is comprised of a second comb-shaped wire being grounded, the second source voltage wire is comprised of a third comb-shaped wire being electrically connected to a voltage source, and the second ground wire is comprised of a fourth comb-shaped wire being grounded, the first and second wires being arranged such that teeth of the first comb-shaped wire are located between teeth of the second comb-shaped wire in the same plane, the third and fourth wires being arranged such that teeth of the third comb-shaped wire are located between teeth of the fourth comb-shaped wire in the same plane.

It is preferable that the first source voltage wire is electrically connected to the second source voltage wire, and the first ground wire is electrically connected to the second ground wire.

The semiconductor device may further include a protection device fabricated below the bypass capacitor, the protection device including (a) a substrate formed at a surface with a first well having a first electrical conductivity and a second well having a second electrical conductivity, (b) a first interlayer insulating film formed on the substrate, (c) a first layer formed on the first interlayer insulating film, (d) a second interlayer insulating film formed on the first layer, and (e) a signal wiring layer formed on the second interlayer insulating film, the first layer including one of the first metal wiring layers, one of the second metal wiring layers, and a second signal wiring layer all electrically connected to the first or second well through via-holes formed through the first interlayer insulating film, the second signal wiring layer being electrically connected to the signal wiring layer through via-holes formed through the second interlayer insulating film.

It is preferable that the input/output area has an extended portion located below the pad area, the extended portion including (a) a substrate formed at a surface with a first well having a first electrical conductivity and a second well having a second electrical conductivity, (b) a first interlayer insulating film formed on the substrate, (c) a first layer formed on the first interlayer insulating film, (d) a second interlayer insulating film formed on the first layer, and (e) a signal wiring layer formed on second interlayer insulating film, the first layer including one of the first metal wiring layers electrically connected to the first well through a via-hole formed through the first interlayer insulating film, one of the second metal wiring layers electrically connected to the second well through a via-hole formed through the first interlayer insulating film, and a second signal wiring layer electrically connected to the first or second well through via-holes formed through the first interlayer insulating film, the second signal wiring layer being electrically connected to the signal wiring layer through via-holes formed through the second interlayer insulating film.

There is still further provided a semiconductor device having a plurality of wiring layers in a multi-layered structure, the semiconductor device including an inner area at a surface, an input/output area surrounding the inner area therein, and a pad area surrounding the input/output area therein, the semiconductor device including a plurality of input/output terminals in the input/output area, and a plurality of pads in the pad area, the semiconductor device including (a) a first source voltage wire being electrically connected to a voltage source and surrounding the inner area in the pad area, and (b) a first ground wire being grounded and surrounding the first source voltage wire in the pad area, each of the pads being electrically connected to any one of the input/output terminals, the first source voltage wire, and the first ground wire, the semiconductor device including a protection device fabricated below the pad area, the protection device including (a) a substrate formed at a surface with a first well having a first electrical conductivity and a second well having a second electrical conductivity, (b) a first interlayer insulating film formed on the substrate, (c) a first layer formed on the first interlayer insulating film, (d) a second interlayer insulating film formed on the first layer, and (e) a signal wiring layer formed on second interlayer insulating film, the first layer including one of the first metal wiring layers, one of the second metal wiring layers, and a second signal wiring layer all electrically connected to the first or second well through via-holes formed through the first interlayer insulating film, the second signal wiring layer being electrically connected to the signal wiring layer through via holes formed through the second interlayer insulating film.

There is yet further provided a semiconductor device having a plurality of wiring layers in a multi-layered structure, the semiconductor device including an inner area at a surface, an input/output area surrounding the inner area therein, and a pad area surrounding the input/output area therein, the semiconductor device including a plurality of input/output terminals in the input/output area, and a plurality of pads in the pad area, the semiconductor device including (a) a first source voltage wire being electrically connected to a voltage source and surrounding the inner area in the pad area, and (b) a first ground wire being grounded and surrounding the first source voltage wire in the pad area, each of the pads being electrically connected to any one of the input/output terminals, the first source voltage wire, and the first ground wire, the input/output area having an extended portion located below the pad area, the extended portion including (a) a substrate formed at a surface with a first well having a first electrical conductivity and a second well having a second electrical conductivity, (b) a first interlayer insulating film formed on the substrate, (c) a first layer formed on the first interlayer insulating film, (d) a second interlayer insulating film formed on the first layer, and (e) a signal wiring layer formed on second interlayer insulating film, the first layer including one of the first metal wiring layers electrically connected to the first well through a via-hole formed through the first interlayer insulating film, one of the second metal wiring layers electrically connected to the second well through a via-hole formed through the first interlayer insulating film, and a second signal wiring layer electrically connected to the first or second well through via-holes formed through the first interlayer insulating film, the second signal wiring layer being electrically connected to the signal wiring layer through via-holes formed through the second interlayer insulating film.

In another aspect of the present invention, there is provided a method of fabricating a semiconductor device having a plurality of wiring layers in a multi-layered structure, and having an inner area at a surface and a pad area surrounding the inner area therein, the method including the steps of (a) forming the inner area, and (b) fabricating a device below the pad area, the steps (a) and (b) being to be concurrently carried out.

For instance, at least one of a bypass capacitor, a protection device, and an input/output device is fabricated as the device in the step (b).

The method may further include the step of (c) fabricating a second device below the device.

It is preferable that the step (c) is carried out concurrently with the steps (a) and (b).

It is preferable that a bypass capacitor is fabricated as the device in the step (b), and at least one of a protection device and an input/output device is fabricated as the second device in the step (c).

The advantages obtained by the aforementioned present invention will be described hereinbelow.

In the semiconductor device in accordance with the present invention, a device is fabricated below the pad area. Accordingly, a device such as a bypass capacitor can be fabricated without occupying a space. The thus fabricated bypass capacitor would enhance a resistance to noises and a radio-frequency characteristic in a power source line without increasing pads in number.

The above and other objects and advantageous features of the present invention will be made apparent from the following description made with reference, to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1A:
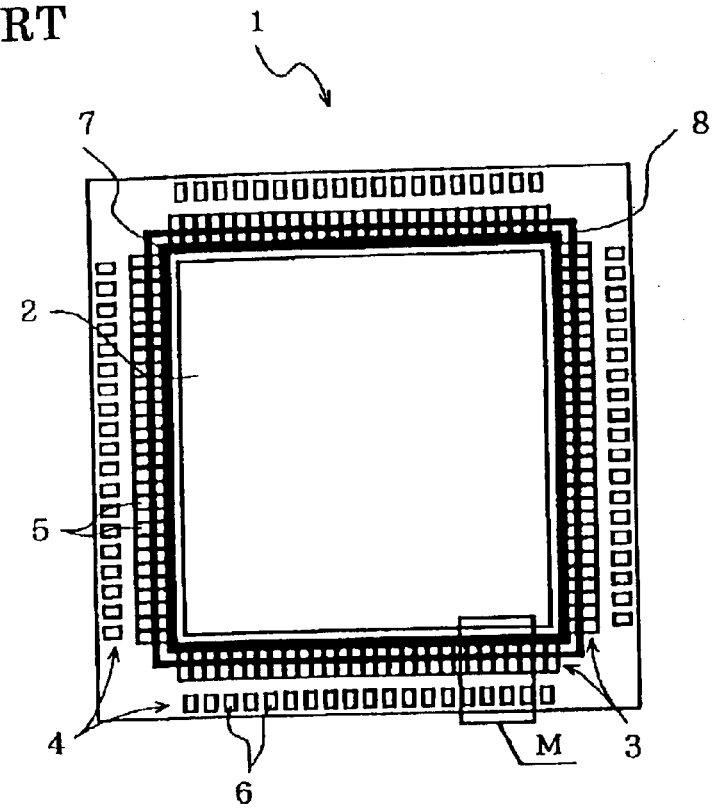
FIG. 1A is a top plan view of a conventional LSI chip.
Figure 1B:
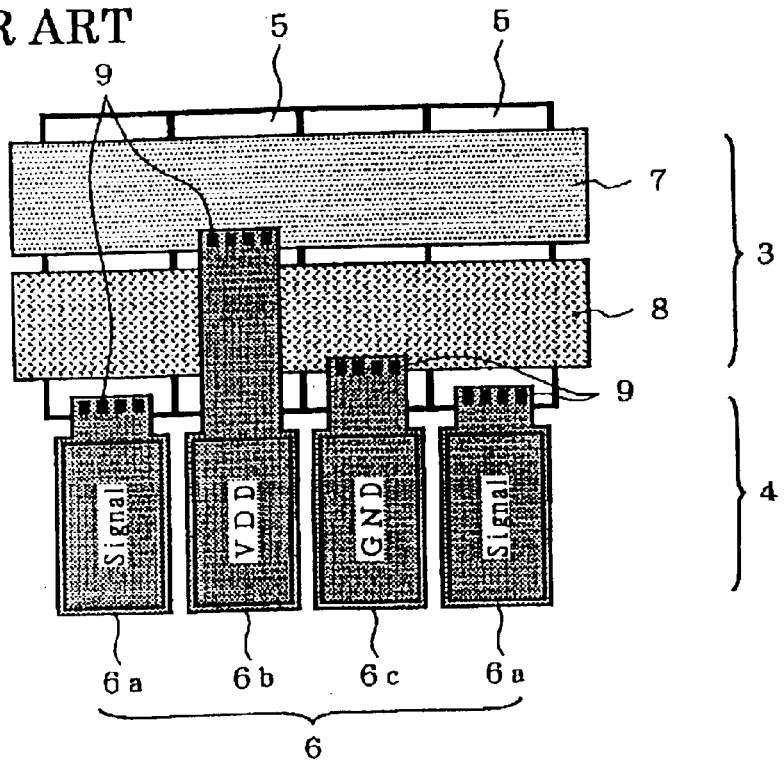
FIG. 1B is an enlarged view of the area M in FIG. 1A.
Figure 2A:
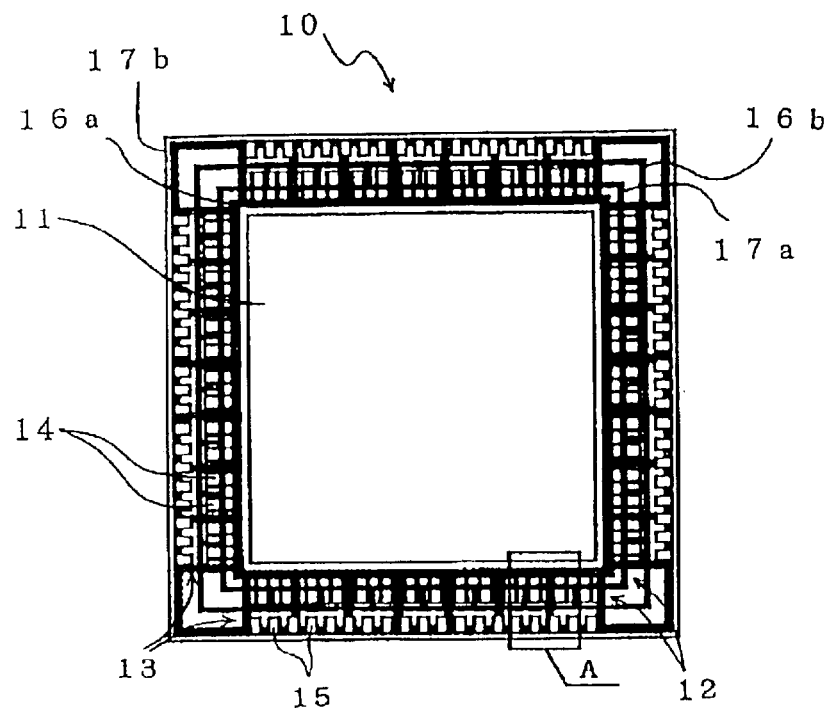
FIG. 2A is a top plan view of a semiconductor device in accordance with the first embodiment of the present invention.
Figure 2B:
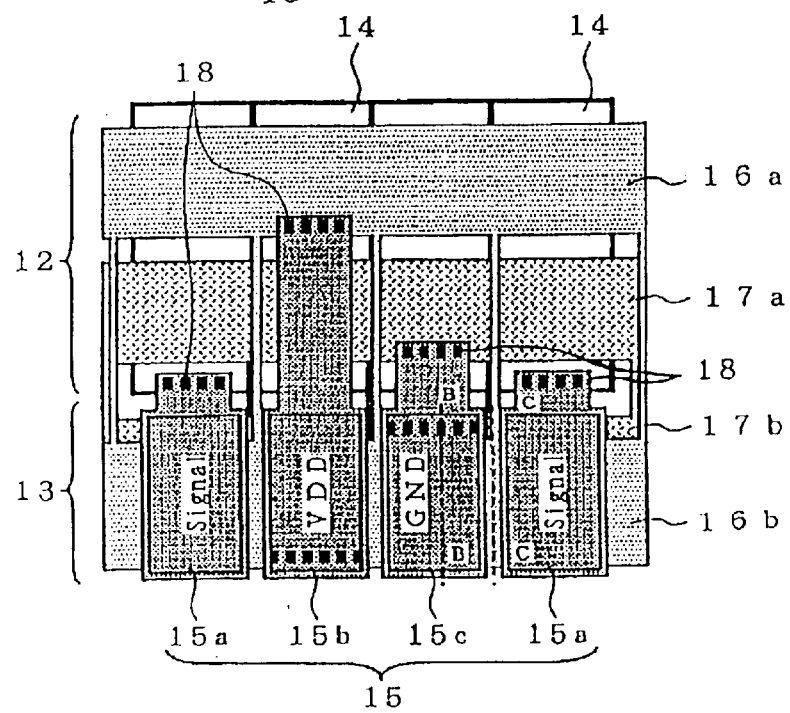
FIG. 2B is an enlarged view of the area A in FIG. 2A.
Figure 3A:
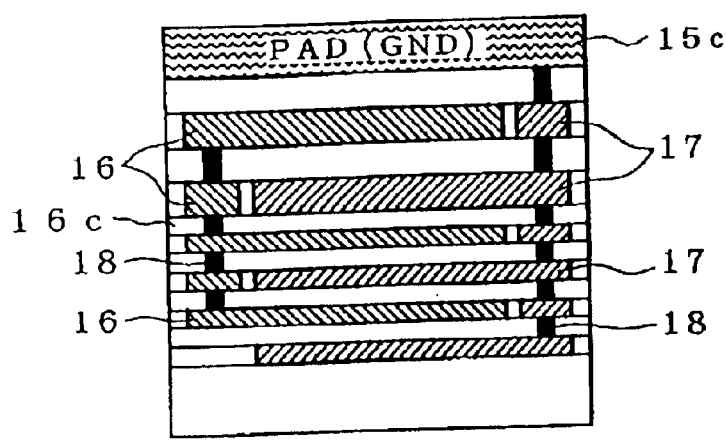
FIG. 3A is a cross-sectional view taken along the line B—B in FIG. 2B.
Figure 3B:
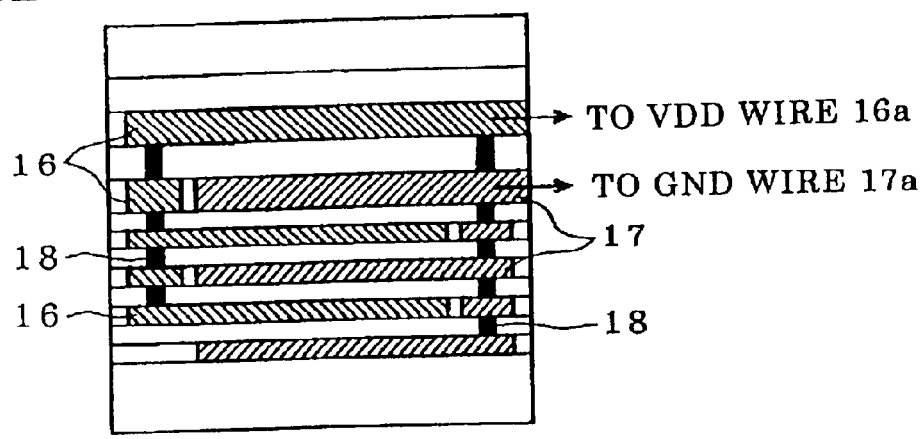
FIG. 3B is a cross-sectional view taken along the line C—C in FIG. 2B.

FIGS. 2A, 2B, 3A and 3B illustrate a LSI chip 10 as a semiconductor device in accordance with the first embodiment of the present invention. FIG. 2A is a top plan view of the LSI chip 10, FIG. 2B is an enlarged view of the area A in FIG. 2A, FIG. 3A is a cross-sectional view taken along the line B—B in FIG. 2B, and FIG. 3B is a cross-sectional view taken along the line C—C in FIG. 2B The LSI chip 10 includes a plurality of wiring layers in a multi-layered structure. As illustrated in FIG. 2A, the LSI chip 10 is comprised of an inner area 11 located centrally at a surface of the LSI chip 10, an input/output area 12 located around the inner area 11, and a pad area 13 located around the input/output area 12

In the input/output area 12, a plurality of input/output terminal 14 are arranged in a square pattern, surrounding the inner area 11. In the pad area 13, a plurality of pads 15 are arranged in a square pattern, surrounding the input/output area 12.

In the input/output area 12, there are formed a first wire 16a in a square pattern, surrounding the inner area 11, and a second wire 17a in a square pattern, surrounding the first wire 16a. The first wire 16a is electrically connected to a voltage source (not illustrated), and the second wire 17a is grounded. Hence, the first wire 16a is called the VDD wire 16a, and the second wire 17a is called GND wire 17a hereinafter.

In the pad area 13, there are formed a first wire 16b in a square pattern, surrounding the inner area 11, and a second wire 17b in a square pattern, surrounding the first wire 16b. The first wire 16b is electrically connected to a voltage source (not illustrated), and the second wire 17b is grounded. Hence, the first wire 16b is called the VDD wire 16b, and the second wire 17b is called GND wire 17b hereinafter.

As illustrated in FIG. 2B, the pads 15 are electrically connected to the input/output terminal 14, the VDD wire 16b or the GND wire 17b through a via contact 18. Hereinbelow, a pad 15 electrically connected to the input/output terminal 14 is called a signal pad 15a, a pad 15 electrically connected to the VDD wire 16b is called a VDD pad 15b, and a pad 15 electrically connected to the second wire 17b is called a GND pad 15c.

As illustrated in FIGS. 3A and 3B, the VDD wire 16b in the pad area 13 is comprised of a plurality of first metal wiring layers 16 in a multi-layered structure. The first metal wiring layers 16 are electrically connected to one another through via contacts 18 formed through first interlayer insulating films 16c sandwiched between the first metal wiring layers 16.

Similarly, the GND wire 17b in the pad area 13 is comprised of a plurality of second metal wiring layers 17 in a multi-layered structure. The second metal wiring layers 17 are electrically connected to one another through via contacts 18 formed through the first interlayer insulating films 16c.

Each of the first metal wiring layers 16 and each of the second metal wiring layers 17 are formed in the same layer, and separated away from each other.

Vertically overlapping first and second metal wiring layers 16 and 17 with one of the first interlayer insulating films 16c being sandwiched therebetween define a bypass capacitor.

Though not illustrated, the VDD wire 16a in the input/output area 12 has the same structure as that of the VDD wire 16b in the pad area 13. Specifically, the VDD wire 16a is comprised of a plurality of first metal wiring layers 16 in a multi-layered structure. The first metal wiring layers 16 are electrically connected to one another through via contacts 18 formed through first interlayer insulating films 16c sandwiched between the first metal wiring layers 16.

The GND wire 17a in the input/output area 12 has the same structure as that of the VDD wire 17b in the pad area 13. Specifically, the GND wire 17a in the input/output area 12 is comprised of a plurality of second metal wiring layers 17 in a multi-layered structure. The second metal wiring layers 17 are electrically connected to one another through via contacts 18 formed through the first interlayer insulating films 16c.

Each of the first metal wiring layers 16 and each of the second metal wiring layers 17 are formed in the same layer, and separated away from each other.

Vertically overlapping first and second metal wiring layers 16 and 17 with one of the first interlayer insulating films 16c being sandwiched therebetween define a bypass capacitor.

As illustrated in FIG. 3B, the VDD wire 11b in the pad area 13 is electrically connected to the VDD wire 16a in the input/output area 12, and the GND wire 17b in the pad area 13 is electrically connected to the GND wire 17a in the input/output area 12.

As mentioned above, the LSI chip 10 in accordance with the first embodiment is designed to include the VDD wire 16a and the GND wire 17a in the input/output area 12, and the VDD wire 16b and the GND wire 17b in the pad area 13, and further include not only a bypass capacitor defined in the input/output area 12, but also a bypass capacitor defined by non-used metal wiring layers located below the pads 15 in the pad area 13.

Figure 4:
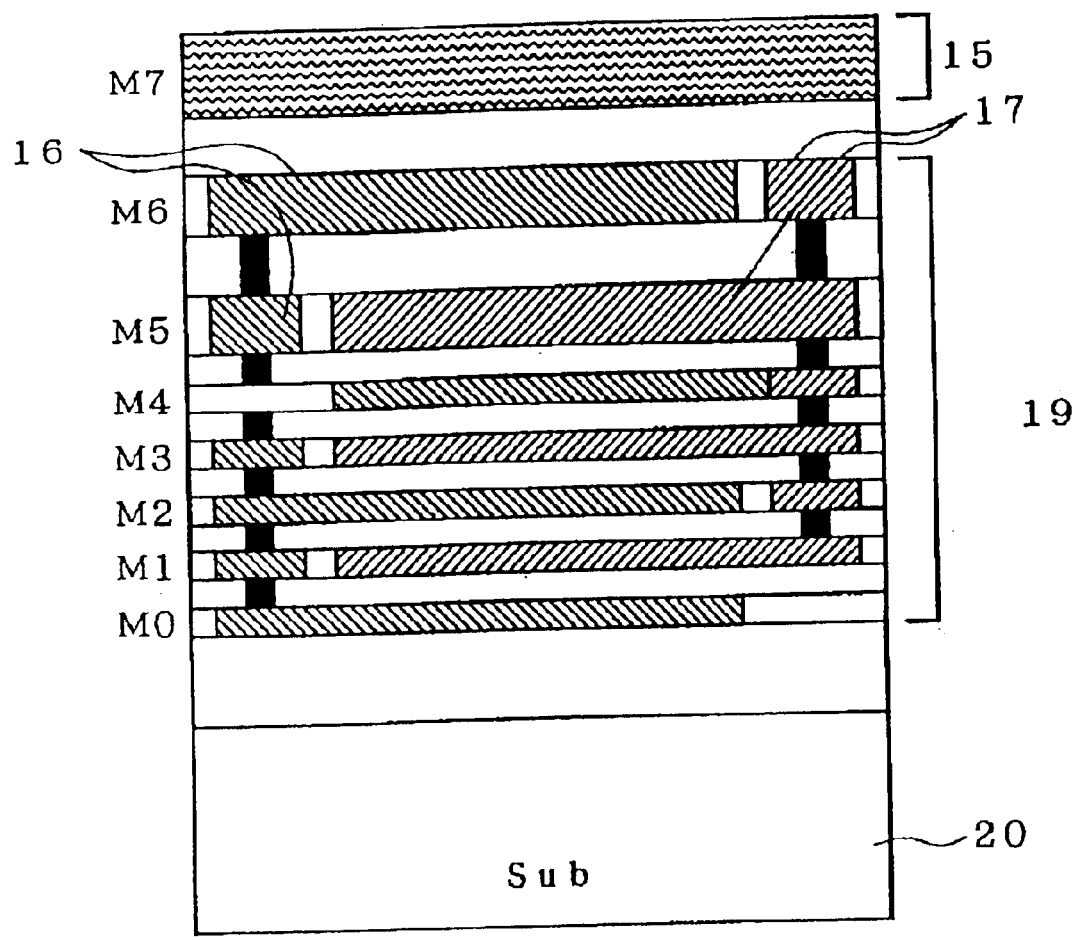
FIG. 4 is a partial cross-sectional view of a semiconductor device.
Figure 5:
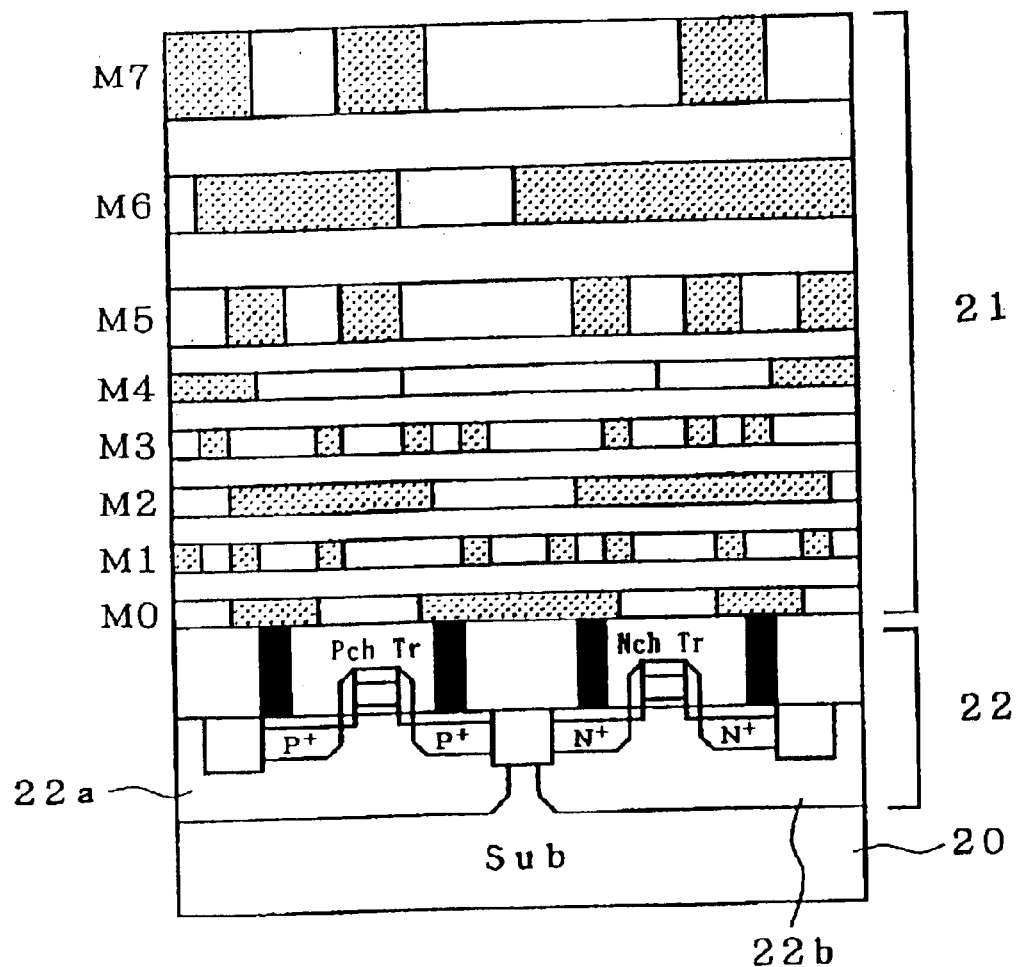
FIG. 5 is a partial cross-sectional view of a semiconductor device.

FIG. 4 is a cross-sectional view illustrating a portion of the LSI chip 10 located below the pad 15, and FIG. 5 is a cross-sectional view illustrating an inner structure of the LSI chip 10.

As illustrated in FIG. 5, the LSI chip 10 includes a substrate 20, a transistor 22 formed on the substrate 20, and a wiring section 21 formed above the transistor 22 in the inner area 11.

The transistor 22 is comprised of a p-channel transistor fabricated on a n-well 22a formed at a surface of the substrate 20, and a n-channel transistor fabricated on a p-well 22b formed at a surface of the substrate 20.

The wiring section 21 is comprised of eight metal wiring layers M0 to M7, and interlayer insulating layers sandwiched between the metal wiring layers M0 to M7.

When the LSI chip 10 is fabricated, as illustrated in FIG. 4, the seven metal wiring layers M0 to M6 are formed on the substrate 20 below the pad 15 in order to define a bypass capacitor 19 in the pad area 13.

Namely, the seven metal wiring layers M0 to M6 and the pad 15 as an eighth metal wiring layer M7, totally eight metal wiring layers M0 to M7, are formed in the pad area 13.

As mentioned earlier, the wiring section 21 is comprised of eighth metal wiring layers M0 to M7. Thus, the number of the metal wiring layers formed in the pad area 13 is equal to the number of the metal wiring layers defining the wiring section 21 to be formed in the inner area 11.

Thus, when the LSI chip 10 is fabricated, the metal wiring layers M0 to M7 in the inner area 11 (see FIG. 5) and the metal wiring layers M0 to M7 in the pad area (see FIG. 4) can be concurrently formed, resulting in that it is no longer necessary to form the metal wiring layers M0 to M7 in the pad area 13 separately from the metal wiring layers M0 to M7 to be formed in the inner area 11. Hence, since the number of fabrication steps is not increased in order to define the bypass capacitor in the pad area 13, even if the bypass capacitor 19 is formed in the pad area 13, the number of steps for fabricating the LSI chip 10 remains the same as the number of steps for fabricating the LSI chip 10 without the bypass capacitor As explained so far, in accordance with the first embodiment, the bypass capacitor 19 is fabricated in the pad area 13 which was a dead space, ensuring enhancement in a resistance to noises and also in a radio-frequency characteristic in a power source line without newly preparing a space for forming a bypass capacitor therein.

In addition, since the bypass capacitor 19 having the above-mentioned structure further has a function of a power source line, the LSI chip 10 could have an enhanced resistance to electromigration and IR drop.

As a result, the LSI chip 10 in accordance with the first embodiment makes it no longer necessary to increase power source pads and ground pads in number unlike the conventional LSI chip, ensuring reduction in the number of pads to be added.

A bypass capacitor is generally mounted on a substrate around a chip. However, by forming at least a part of a bypass capacitor in a chip, the LSI chip 10 in accordance with the first embodiment makes it possible to increase a density at which components are mounted on a substrate. This is because a bypass capacitor is constituted of a power source line in a dead space in the pad area 13 in accordance with the first embodiment.

Figure 6:
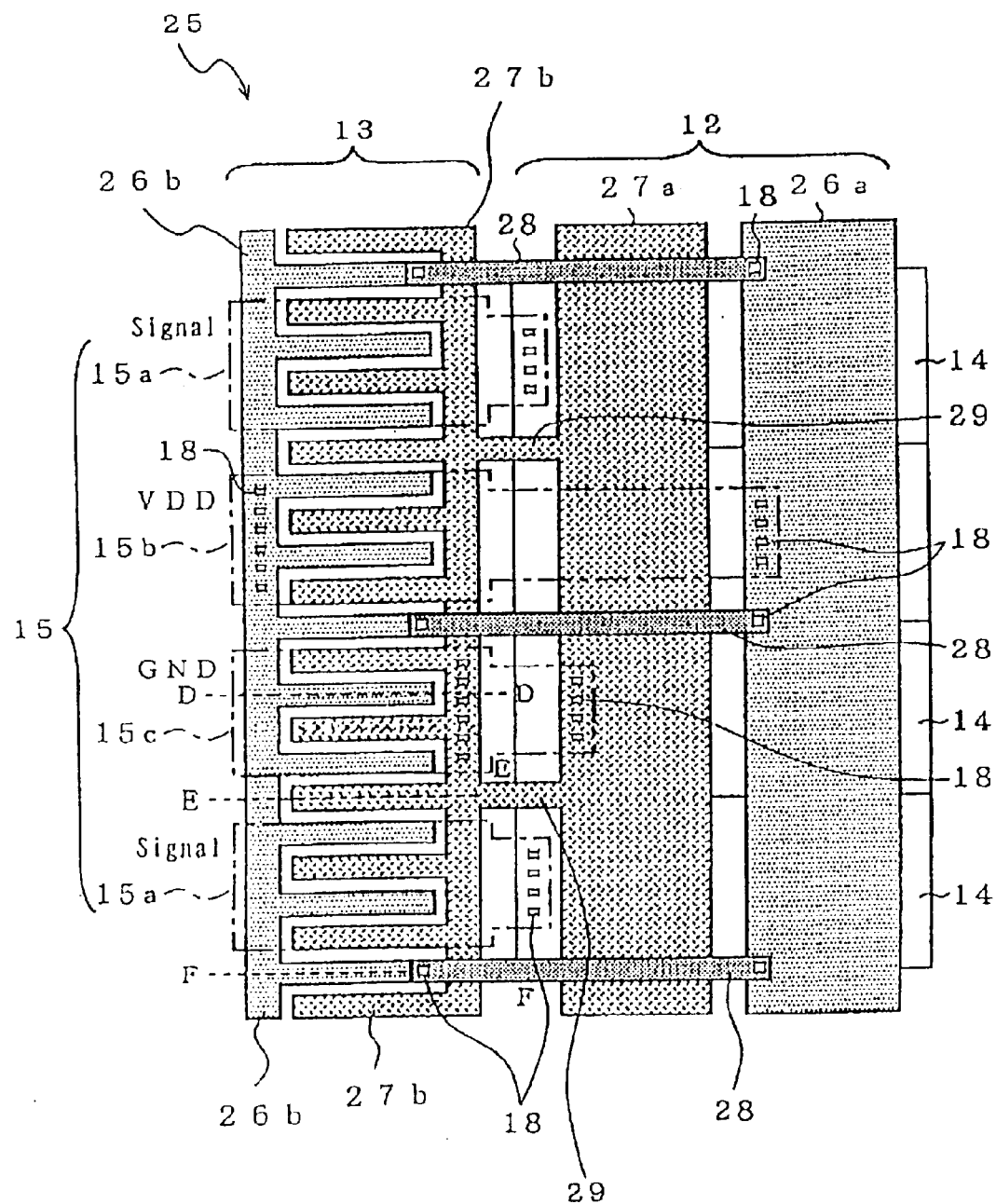
FIG. 6 is a partial top plan view of a semiconductor device in accordance with the second embodiment of the present invention
Figure 7A:
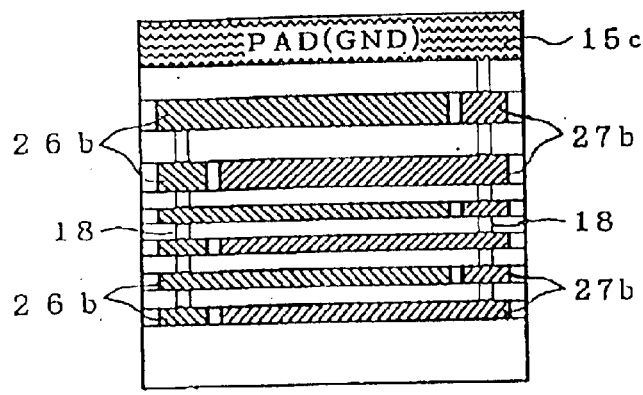
FIG. 7A is a cross-sectional view taken along the line D—D in FIG. 6.
Figure 7B:
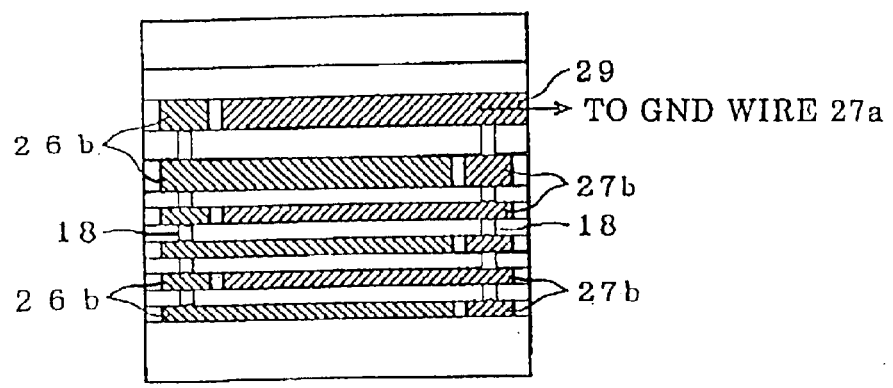
FIG. 7B is a cross-sectional view taken along the line E—E in FIG. 6.
Figure 7C:
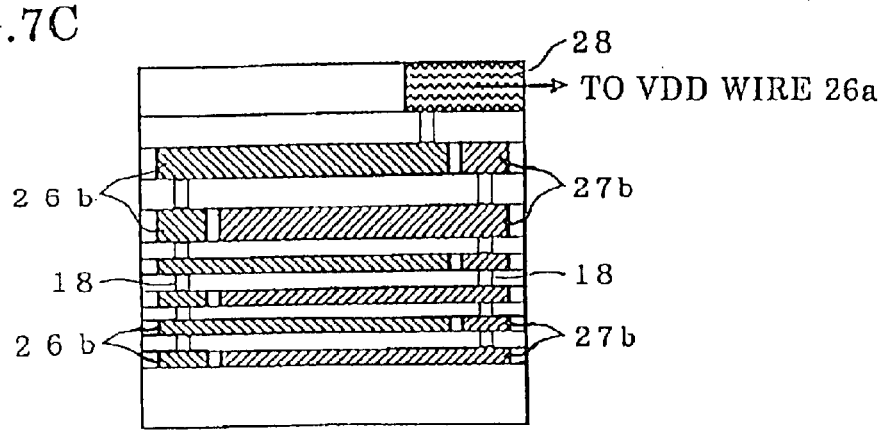
FIG. 7C is a cross-sectional view taken along the line F—F in FIG. 6.

FIG. 6 is a partial top plan view of a LSI chip 25 in accordance with the second embodiment of the present invention. FIG. 7A is a cross-sectional view taken along the line D—D in FIG. 6, FIG. 7B is a cross-sectional view taken along the line E—E in FIG. 6, and FIG. 7C is a cross-sectional view taken along the line F—F in FIG. 6.

The LSI chip 25 in accordance with the second embodiment has the same structure as the structure of the LSI chip 10 except that the LSI chip 25 is designed to include a VDD wire 26a and a GND wire 27a in place of the VDD wire 16a and the GND wire 17a, and further include a VDD wire 26b and a GND wire 27b in place of the VDD wire 16b and the GND wire 17b.

As illustrated in FIG. 6, the VDD wire 26b is comprised of a first comb-shaped wire being electrically connected to a voltage source, and the GND wire 27b is comprised of a second comb-shaped wire being grounded. The VDD wires 26a and the GND 27b are arranged such that teeth of the first comb-shaped wire are located between teeth of the second comb-shaped wire in the same plane.

The VDD wire 26a has the same structure as that of the VDD wire 16b, and the GND wire 27a has the same structure as that of the VDD wire 17b. A positional relationship between the VDD wire 26a and the GND wire 27a is identical to the positional relationship between the VDD wire 16b and the GND wire 17b.

As illustrated in FIG. 7C, the VDD wire 26b formed in the pad area 13 is electrically connected to the VDD wire 26a formed in the input/output area 12 through a first electrical connector 28. Similarly, as illustrated in FIG. 7B, the GND wire 27b formed in the pad area 13 is electrically connected to the GND wire 27a formed in the input/output area 12 through a second electrical connector 29.

As mentioned above, the LSI chip 25 in accordance with the second embodiment is designed to include the VDD wire 26a and the GND wire 27a in the input/output area 12, and the VDD wire 26b and the GND wire 27b in the pad area 13, and further include not only a bypass capacitor defined in the input/output area 12, but also a bypass capacitor defined by non-used metal wiring layers located below the pads 15 in the pad area 13.

In accordance with the second embodiment, the bypass capacitor could have an increased capacity, because an additional capacity is defined between the teeth of the VDD wire 26b and teeth of the GND wire 27b.

Figure 8A:
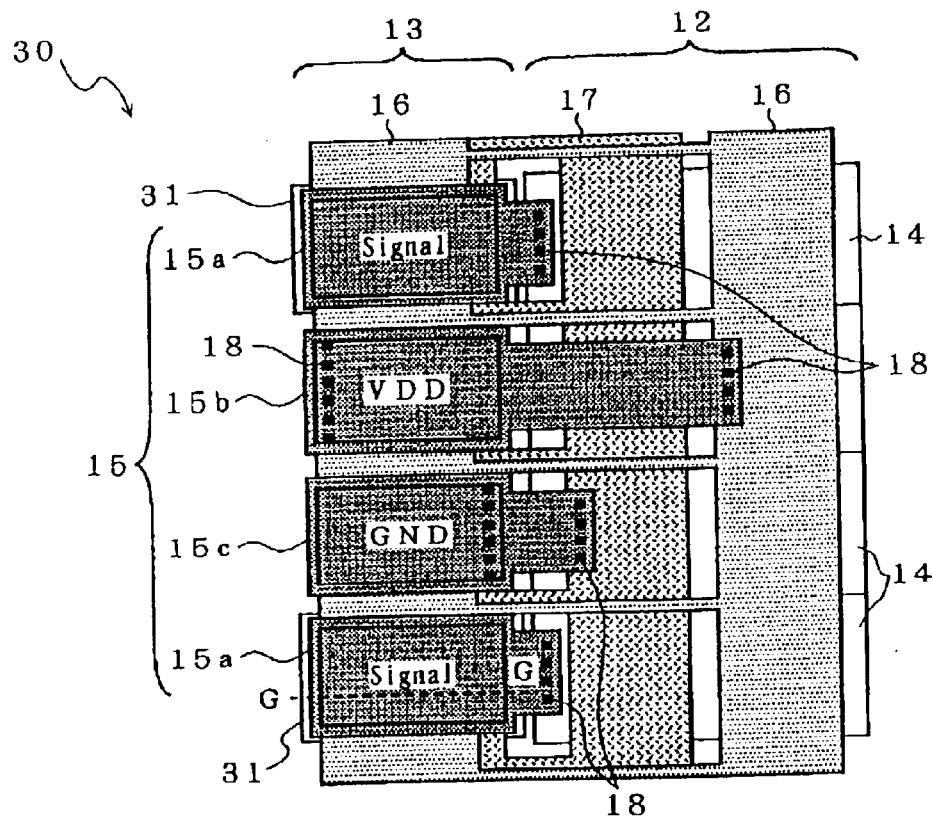
FIG. 8A is a partial top plan view of a semiconductor device in accordance with the third embodiment of the present invention.
Figure 8B:
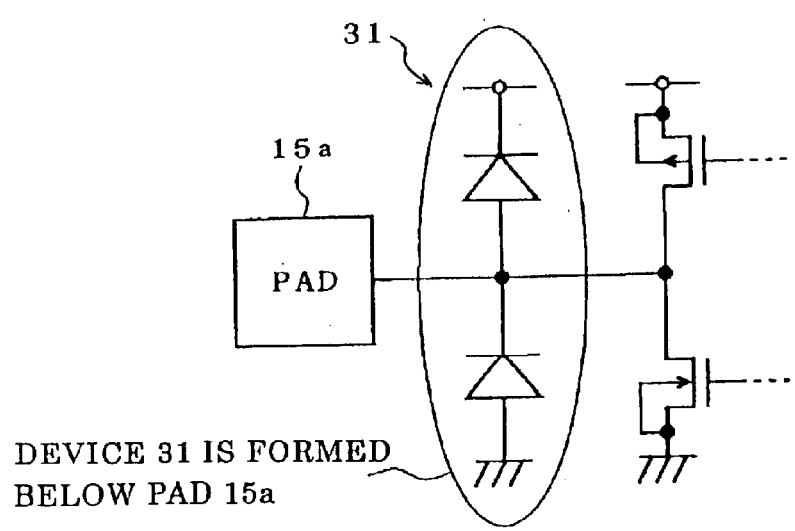
FIG. 8B is a partial circuit diagram of the semiconductor device in accordance with the third embodiment of the present invention.
Figure 9:
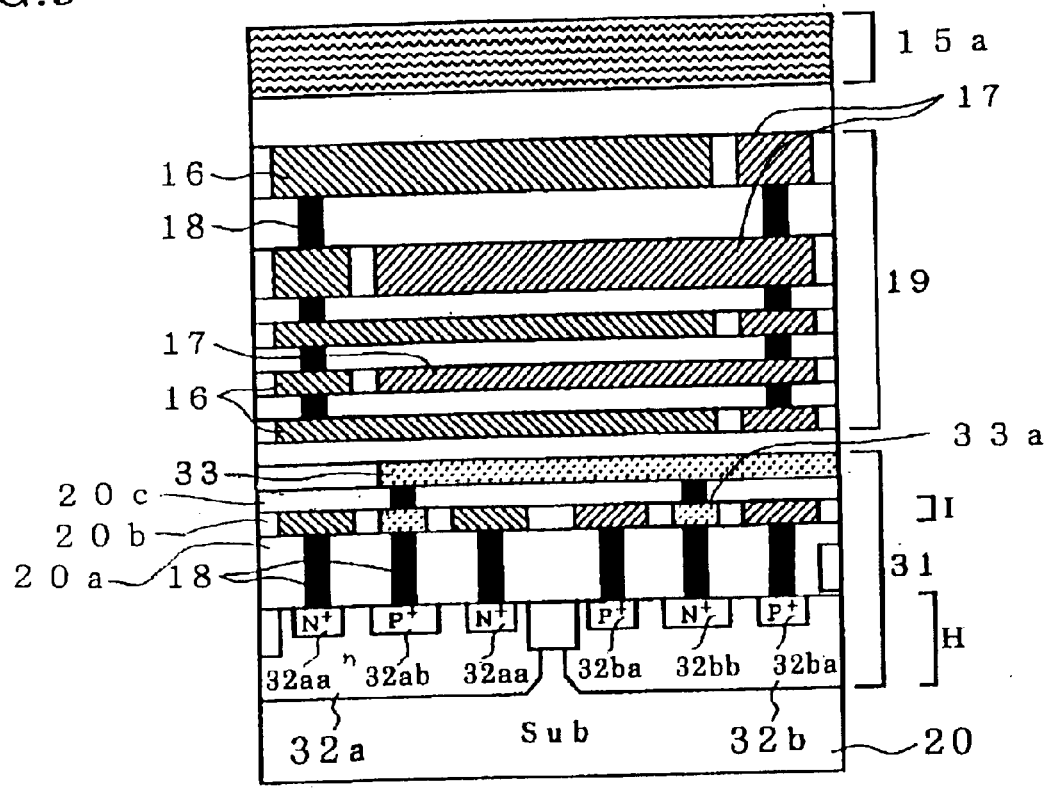
FIG. 9 is a cross-sectional view taken along the line G—G in FIG. 8A.
Figure 10A:
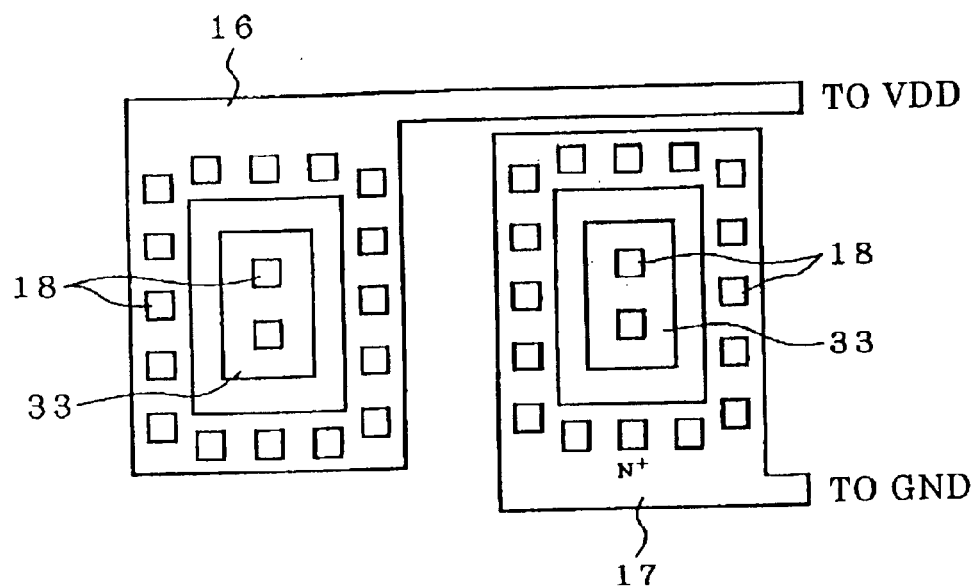
FIG. 10A is a plan view of the section H in FIG. 9.
Figure 10B:
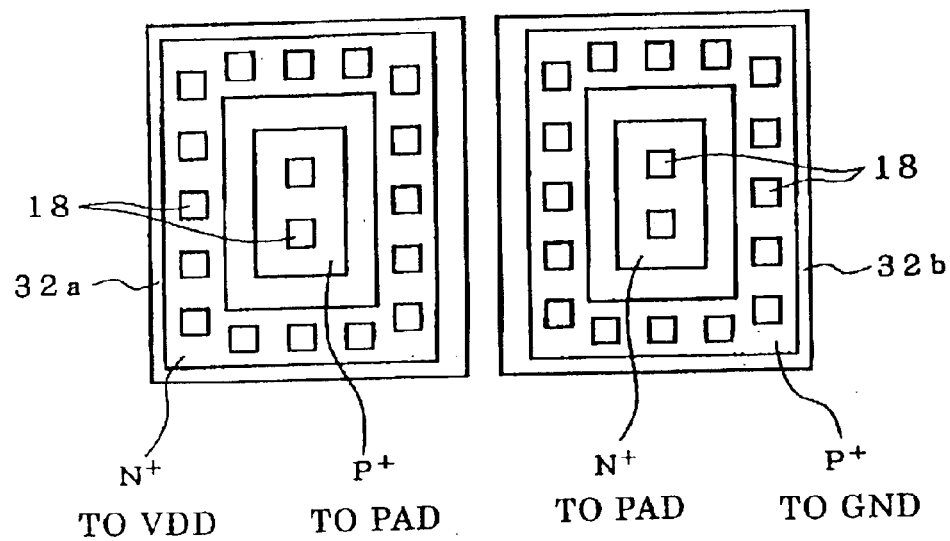
FIG. 10B is a plan view of the section I in FIG. 9.

FIGS. 8A, 8B, 9, 10A and 10B illustrate a LSI chip 30 in accordance with the third embodiment. FIG. 8A is a top plan view of the LSI chip 30, FIG. 8B is a partial circuit diagram of the LSI chip 30, FIG. 9 is a cross-sectional view taken along the line G—G in FIG. 8A, FIG. 10A is a plan view of the section H in FIG. 9, and FIG. 10B is a plan view of the section I in FIG. 9.

As illustrated in FIG. 8A, the LSI chip 30 in accordance with the third embodiment is designed to include not only a bypass capacitor 19 (see FIG. 9), but also a protection device 31 such as a diode (see FIG. 8B) below the signal pad 15a in the pad area 13. The LSI chip 30 has the same structure as the structure of the LSI chip 10 except additionally having the protection device 31.

The bypass capacitor 19 in the third embodiment has the same structure as the structure of the bypass capacitor 19 in the first embodiment, illustrated in FIG. 3A or 3B.

As illustrated in FIG. 9, below the bypass capacitor 19 is fabricated the protection device 31.

The protection device 31 is comprised of a substrate 20 formed at a surface with a n-type well 32a and a p-type well 32b, a first interlayer insulating film 20a formed on the substrate 20, a first layer 20b formed on the first interlayer insulating film 20a, a second interlayer insulating film 20c formed on the first layer 20b, and a second signal wiring layer 33 formed on the second interlayer insulating film 20c.

The n-type well 32a is formed at a surface thereof with a heavily doped p-type region 32ab and heavily doped n-type regions 32aa, and the p-type well 32b is formed at a surface thereof with heavily doped p-type regions 32ba and a heavily doped n-type region 32bb.

The first layer 20b includes the first metal wiring layers 16, the second metal wiring layers 17, and first signal wiring layers 33a. The first metal wiring layers 16 are electrically connected to the heavily doped n-type regions 32aa formed in the n-type well 32a through via contacts 18. The second metal wiring layers 17 are electrically connected to the heavily doped p-type regions 32ba formed in the p-type well 32b through via contacts 18. One of the first signal wiring layers 33 is electrically connected to the heavily doped p-type region 32ab formed in the p-type well 32a through a via contact 18, and the other is electrically connected to the heavily doped n-type region 32bb formed in the n-type well 32b through a via contact 18.

The second signal wiring layer 33 is electrically connected to the first signal wiring layers 33a through via contacts 18 formed through the second interlayer insulating film 20c.

As illustrated in FIG. 10A, the heavily doped n-type regions 32aa in the n-type well 32a are electrically connected to a source voltage (VDD) through the first metal wiring layer 16, the heavily doped p-type region 32ab in the n-type well 32a is electrically connected to the signal pad 15a through the first and second signal wiring layers 33, the heavily doped n-type region 32bb in the p-type well 32b is electrically connected to the signal pad 15a through the first and second signal wiring layers 33, and the heavily doped p-type regions 32ba in the p-type well 32b are electrically connected to a source voltage (VDD) through the second metal wiring layer 17.

As mentioned above, not only the bypass capacitor 19 but also the protection device 31 can be fabricated below the pad 15 in the pad area 13.

Figure 11:
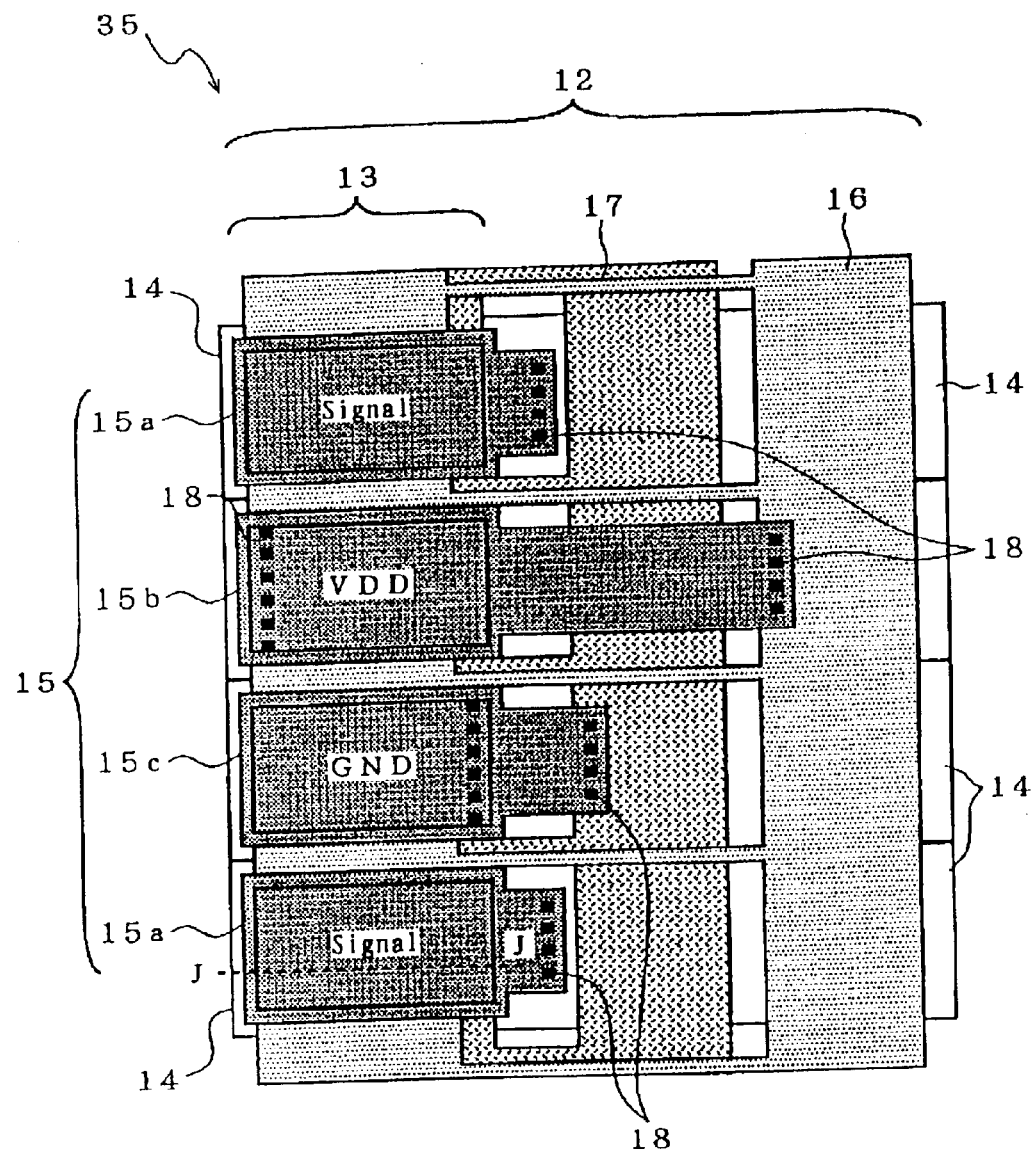
FIG. 11 is a partial top plan view of the semiconductor device in accordance with the fourth embodiment of the present invention.
Figure 12:
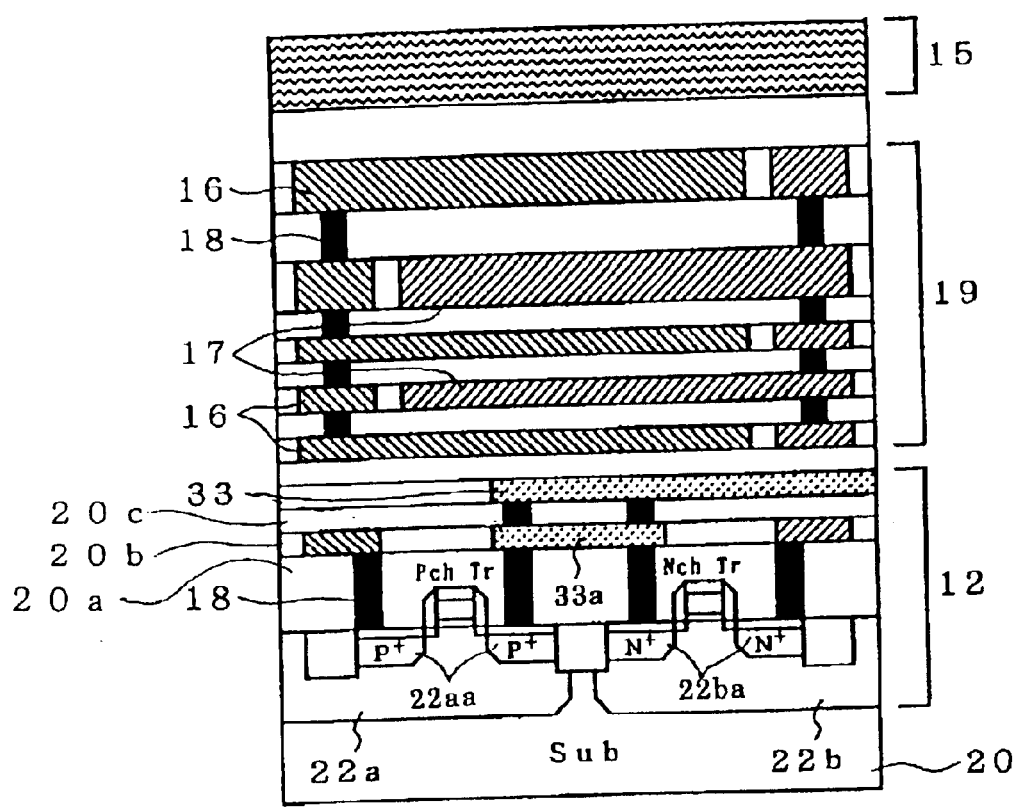
FIG. 12 is a cross-sectional view taken along the line J—J in FIG. 11.

FIGS. 11 and 12 illustrate a LSI chip 35 in accordance with the fourth embodiment. FIG. 11 is a partial top plan view of the LSI chip 35, and FIG. 12 is a cross-sectional view taken along the line J—J in FIG. 11.

As illustrated in FIG. 11, the LSI chip 35 in accordance with the fourth embodiment is designed to include not only a bypass capacitor 19 (see FIG. 12), but also an extended portion of the input/output area 12 (see FIGS. 11 and 12) below the signal pad 15a in the pad area 13. The LSI chip 35 has the same structure as the structure of the LSI chip 10 except additionally having the extended portion of the input/output area 12.

The bypass capacitor 19 in the fourth embodiment has the same structure as the structure of the bypass capacitor 19 in the first embodiment, illustrated in FIG. 3A or 3B.

As illustrated in FIG. 12, below the bypass capacitor 19 is fabricated the extended portion of the input/output area 12.

The extended portion of the input/output area 12 is comprised of a substrate 20 formed at a surface with a n-type well 22a and a p-type well 22b, a first interlayer insulating film 20a formed on the substrate 20, a first layer 20b formed on the first interlayer insulating film 20a, a second interlayer insulating film 20c formed on the first layer 20b, and a second signal wiring layer 33 formed on the second interlayer insulating film 20c.

The n-type well 22a is formed at a surface thereof with a heavily doped p-type region 22aa, and the p-type well 22b is formed at a surface thereof with heavily doped n-type regions 22ba.

The first layer 20b includes the first metal wiring layer 16, the second metal wiring layer 17, and a first signal wiring layer 33a. The first metal wiring layer 16 is electrically connected to the heavily doped p-type region 22aa formed in the n-type well 22a through a via contact 18. The second metal wiring layer 17 is electrically connected to the heavily doped n-type region 22ba formed in the p-type well 22b through a via contact 18. The first signal wiring layer 33a is electrically connected to both the heavily doped p-type region 22aa formed in the n-type well 22a and the heavily doped n-type region 22ba formed in the p-type well 22b through via contacts 18.

The second signal wiring layer 33 is electrically connected to the first signal wiring layer 33a through via contacts 18 formed through the second interlayer insulating film 20c.

The heavily doped p-type regions 22aa in the n-type well 22a are electrically connected to a source voltage (VDD) through the first metal wiring layer 16, and further to the signal pad 15a through the first and second signal wiring layers 33 and 33a. The heavily doped r-type regions 22ba in the p-type well 22b are electrically connected to the signal pad 16a through the first and second signal wiring layers 33 and 33a, and further to a source voltage (VDD) through the second metal wiring layer 17.

As mentioned above, not only the bypass capacitor 19 but also the input/output area 12 cam be fabricated below the pad 15 in the pad area 13. That is, the input/output area 12 can be extended such that an extended portion of the input/output area 12 is located below the signal pad 15a.

Figure 13:
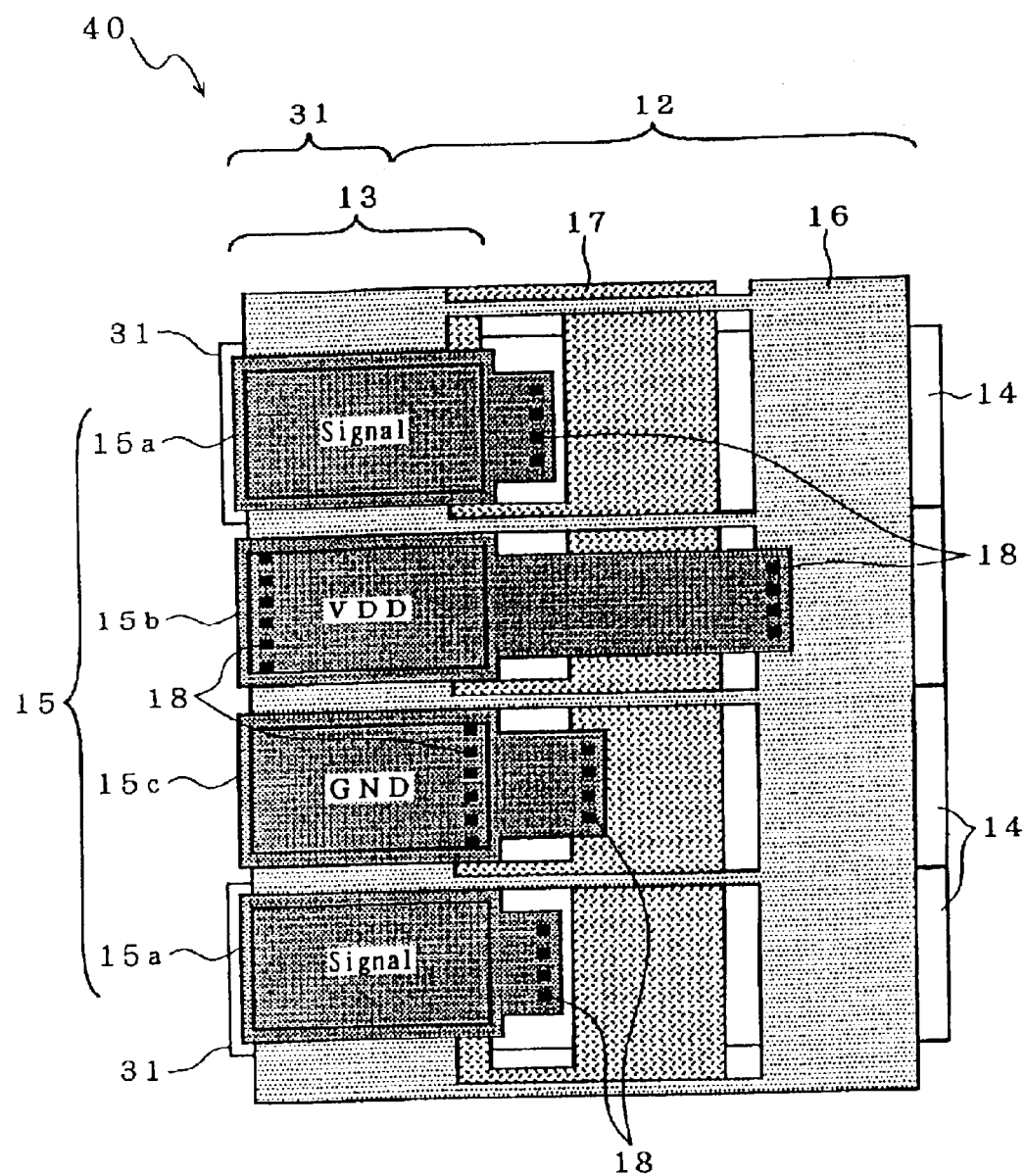
FIG. 13 is a partial top plan view of the semiconductor device in accordance with the fifth embodiment of the present invention.

FIG. 13 illustrates a LSI chip 40 in accordance with the fifth embodiment.

As illustrated in FIG. 13, the LSI chip 40 in accordance with the fifth embodiment is designed to include not only a bypass capacitor 19, but also both a protection device 31 such as a diode and an extended portion of the input/output area 12 below the signal pad 15a in the pad area 13. The LSI chip 40 has the same structure as the structure of the LSI chip 10 except additionally having both the protection device 31 and the extended portion of the input/output area 12.

The bypass capacitor 19 in the fifth embodiment has the same structure as the structure of the bypass capacitor 19 in the first embodiment, illustrated in FIG. 3A or 3B.

The protection device 31 in the fifth embodiment has the same structure as the structure of the protection device 31 in the third embodiment, illustrated in FIGS. 8A, 8B, 9, 10A and 10B.

The extended portion of the input/output area 12 in the fifth embodiment has the same structure as the structure of the extended portion of the input/output area 12 in the fourth embodiment, illustrated in FIGS. 11 and 12.

Figure 14:
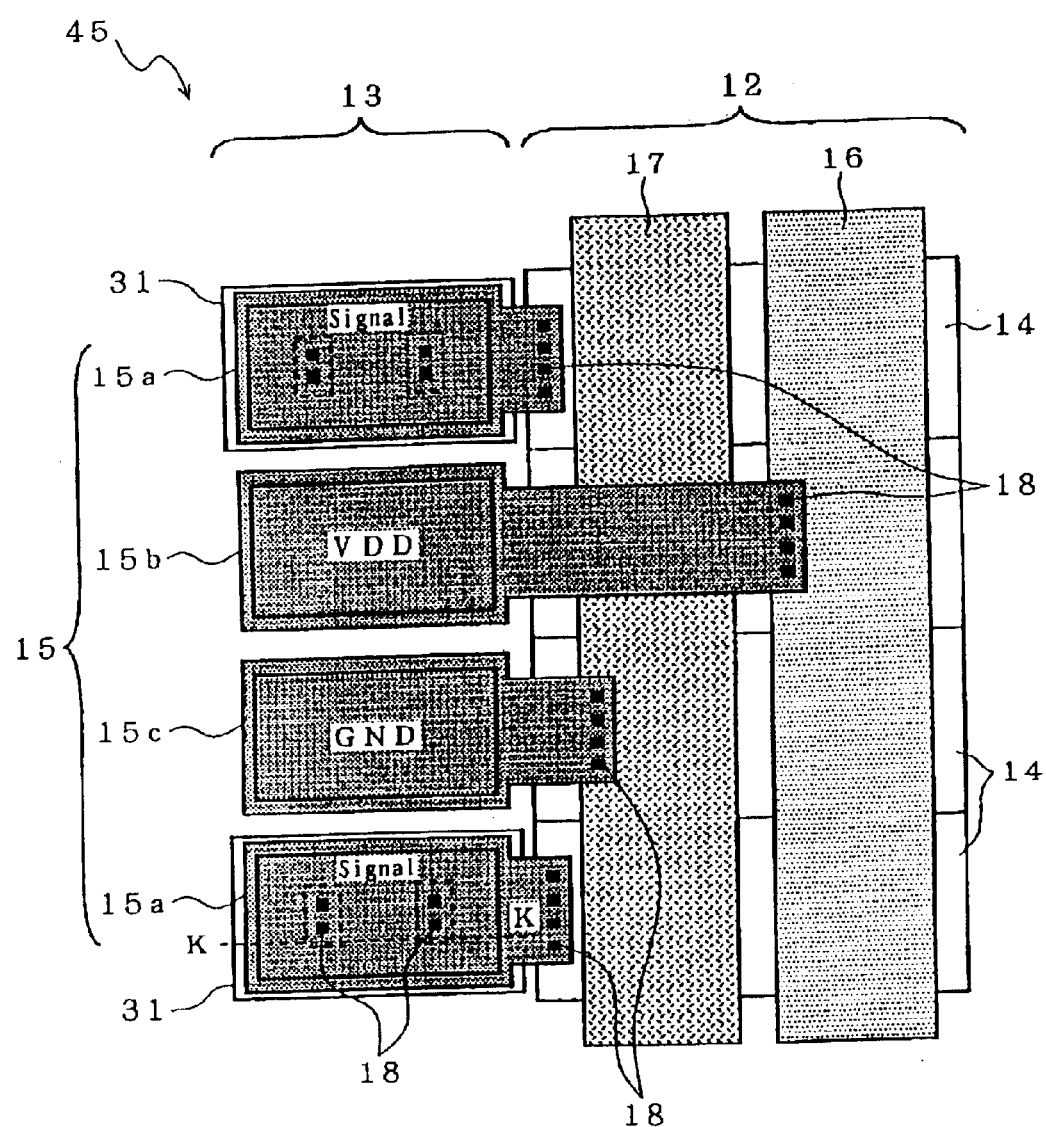
FIG. 14 is a partial top plan view of the semiconductor device in accordance with the sixth embodiment of the present invention.
Figure 15:
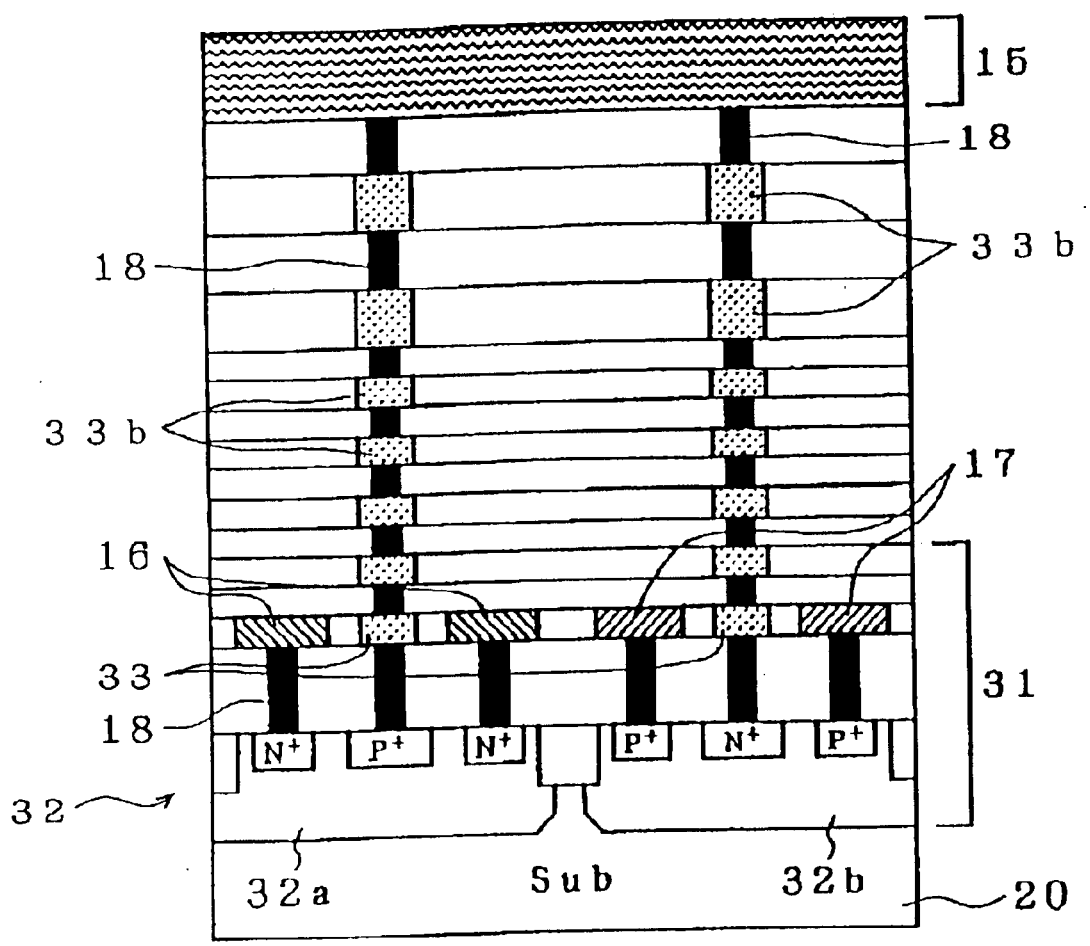
FIG. 15 is a cross-sectional view taken along the line K—K in FIG. 14.

FIG. 14 illustrates a LSI chip 45 in accordance with the sixth embodiment. FIG. 15 is a cross-sectional view taken along the line K—K in FIG. 14.

As illustrated in FIGS. 14 and 15, the LSI chip 45 in accordance with the sixth embodiment is designed not to include a bypass capacitor 19, but designed to include only a protection device 31 such as a diode below the signal pad 15a in the pad area 13. The LSI chip 45 has the same structure as the structure of the LSI chip 10 except having the protection device 31 in place of the bypass capacitor 19.

As illustrated in FIG. 15, below the signal pad 15a is formed a plurality of signal wiring layers 33b in a multi-layered structure. Interlayer insulating layers are sandwiched between the signal wiring layers 33b. The signal wiring layers 33b are electrically connected to one another through via contacts 18 formed through the interlayer insulating layers.

The protection device 31 in the sixth embodiment has the same structure as the structure of the protection device 31 in the third embodiment, illustrated in FIGS. 8A, 8B, 9, 10A and 10B, except that the signal pad 15a is formed with via contacts 18 through which the signal pad 15a is electrically connected to the signal wiring layer 33b.

Figure 16:
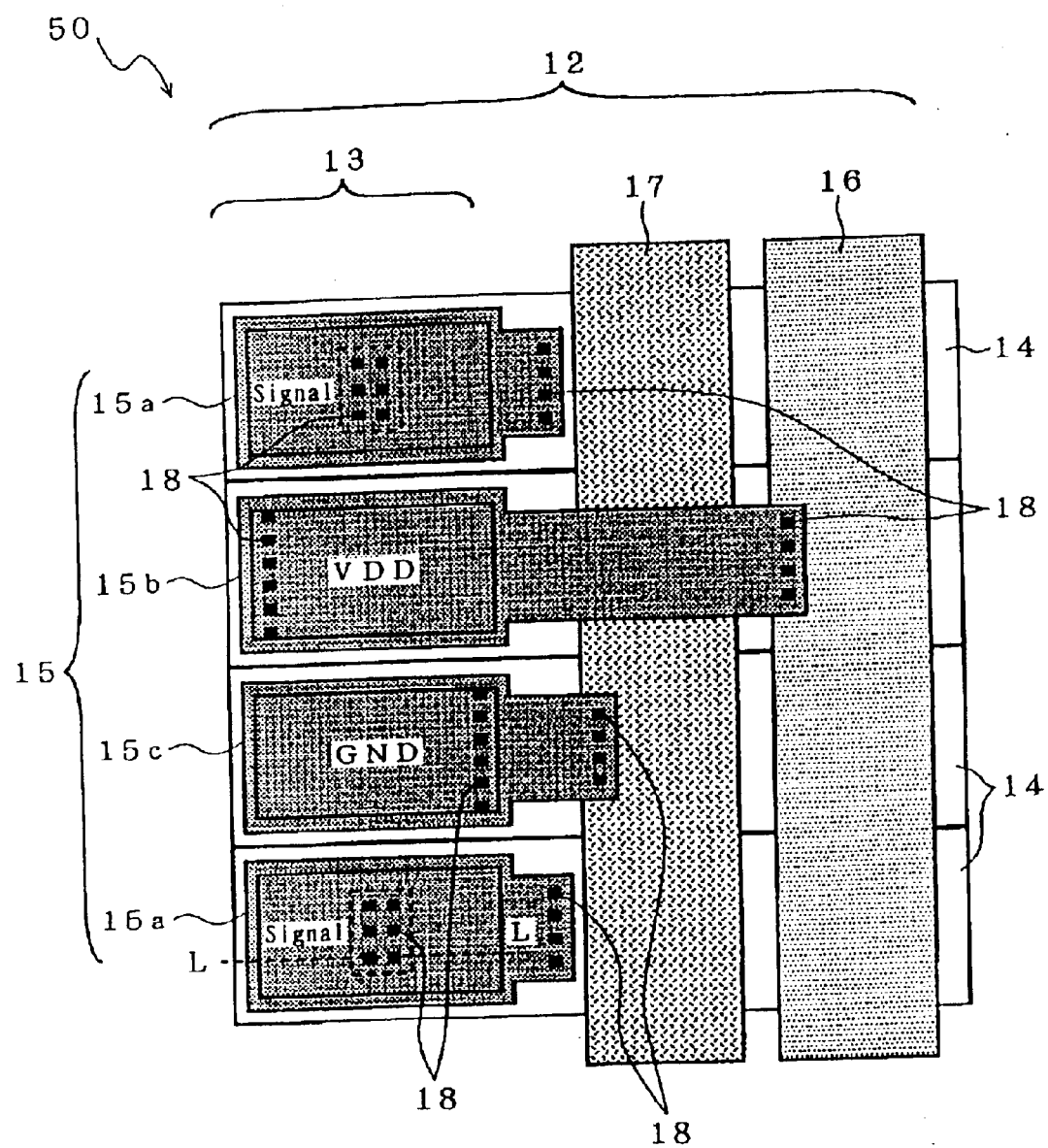
FIG. 16 is a partial top plan view of the semiconductor device in accordance with the seventh embodiment of the present invention.
Figure 17:
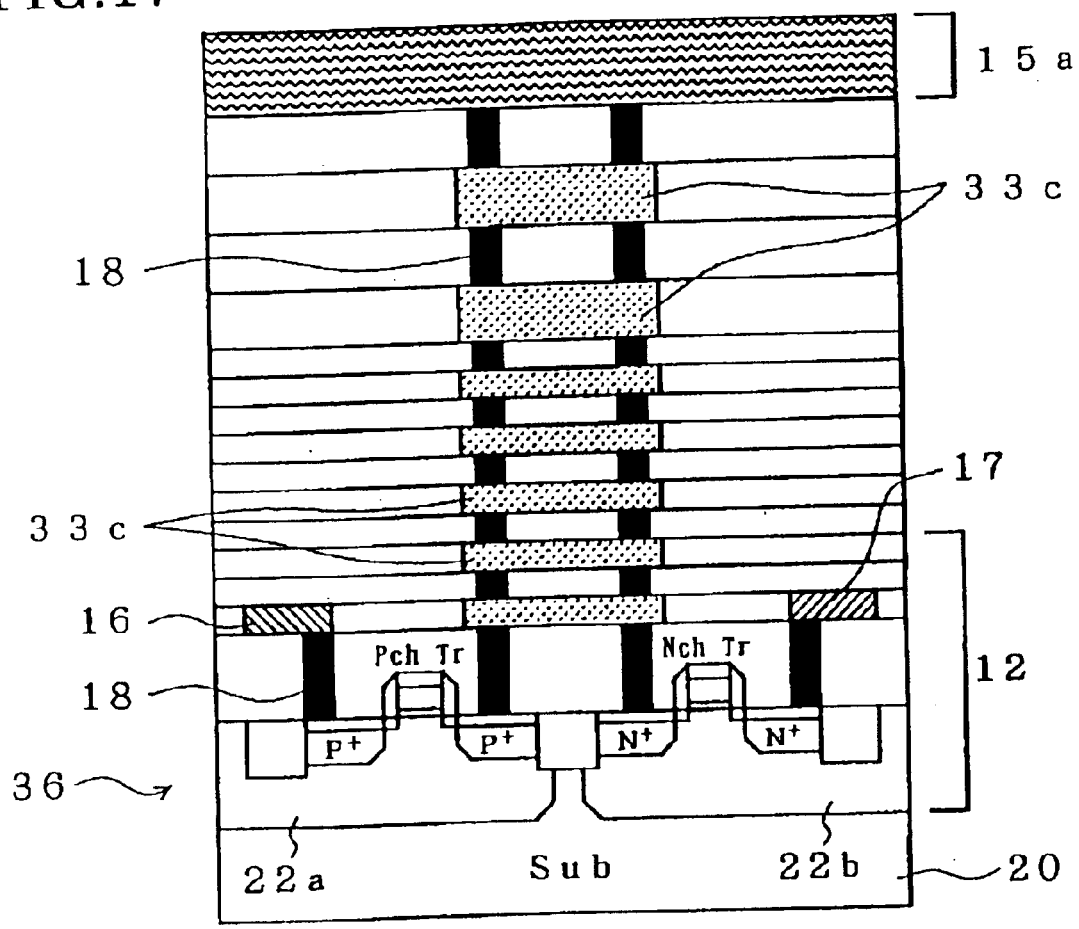
FIG. 17 is a cross-sectional view taken along the line L—L in FIG. 16.

FIG. 16 illustrates a LSI chip 50 in accordance with the seventh embodiment. FIG. 17 is a cross-sectional view taken along the line L—L in FIG. 16.

As illustrated in FIGS. 16 and 17, the LSI chip 50 in accordance with the seventh embodiment is designed not to include a bypass capacitor 19, but designed to include only an extended portion of the input/output are signal pad 15a in the pad area 13. The LSI chip 50 has the same structure as the structure of the LSI chip 10 except having the extended portion of the input/output area 12 in place of the bypass capacitor 19.

As illustrated in FIG. 17, below the signal pad 15a is formed a plurality of signal wiring layers 33c in a multi-layered structure. Interlayer insulating layers are sandwiched between the signal wiring layers 33c. The signal wiring layers 33c are electrically connected to one another through via contacts 18 formed through the interlayer insulating layers.

The extended portion of the input/output area 12 in the seventh embodiment has the same structure as the structure of the extended portion of the input/output area 12 in the fourth embodiment, illustrated in FIGS. 11 and 12, except that the signal pad 15a is formed with via contacts 18 through which the signal pad 16a is electrically connected to the signal wiring layer 33c.

As mentioned earlier, in accordance with the above-mentioned first to seventh embodiments, various devices such as the bypass capacitor 19, the protection device 31 and/or an input/output device defining the input/output area 12 can be fabricated in a dead space located below the pad area 13, for instance, a space located below the signal pad 15a. Thus, it is now possible to efficiently use a space located below the pad 15, which space was not conventionally used because a device fabricated in such a space might be damaged in fabrication steps.

In addition, those devices can be fabricated without an increase in the number of steps for fabricating the LSI chip in accordance with the above-mentioned embodiments. For instance, the LSI chip may be fabricated by a packaging process in which components are assembled by compressive fitting, or a flip-chip process.

In the above-mentioned first to seventh embodiments, the pads 15 are electrically connected any one of the input/output terminal 14, the VDD wire 16b or the GND wire 17b. However, the pads 16 may include pads which are electrically connected to none of the input/output terminal 14, the VDD wire 11b and the GND wire 17b.

Though the same bypass capacitor is formed in the above-mentioned first to seventh embodiments, various bypass capacitors may be formed in dependence on a specific power source, or a bypass capacitor may be formed only for an input/output power source emitting high noises through a power source line.

The bypass capacitor may be designed to have a closed looped layout or a layout partially cut out.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-100732 filed on Apr. 3, 2000 including specification, claims, drawings and summary is incorporated herein by reference in its entirety.

What is claimed is:

1. A semiconductor device having a plurality of wiring layers in a multi-layered structure,
the semiconductor device including an inner area (11) at a surface and a pad area (13) surrounding the inner area (11) therein,
characterized in that the semiconductor device includes a device fabricated below the pad area (13), further comprising a second device fabricated below the device,
the device being comprised of a bypass capacitor (19)
the second device being comprised of at least one of a protection device (31) and an input/output device (12).

2. A semiconductor device having a plurality of wiring layers in a multi-layered structure,
the semiconductor device including an inner area (11) at a surface and a pad area (13) surrounding the inner area (11) therein,
characterized in that the semiconductor device includes a device fabricated below the pad area (13), wherein said device comprises an input/output device.

3. A semiconductor device having a plurality of wiring layers in a multi-layered structure,
the semiconductor device including an inner area (11) at a surface and a pad area (13) surrounding the inner area (11) therein,
characterized in that the semiconductor device includes a device fabricated below the pad area (13) further comprising a second device fabricated below said device,
said device comprises a bypass capacitor,
said second device comprises a protection device.

4. A semiconductor device having a plurality of wiring layers in a multi-layered structure,
the semiconductor device including an inner area (11) at a surface end a pad area (13) surrounding the inner area (11) therein,
characterized in that the semiconductor device includes a device fabricated below the pad area (13), further comprising a second device fabricated below said device,
said device comprises a bypass capacitor,
said second device comprises an input/output device.

5. A semiconductor device having a plurality of wiring layers in a multi-layered structure,
the semiconductor device including an inner area (11) at a surface and a pad area (13) surrounding the inner area (11) therein,
characterized in chat the semiconductor device includes a device fabricated below the pad area (13),
wherein said device comprises a bypass capacitor,
wherein said bypass capacitor comprises metal wire layers arranged below said pad area,
wherein each of said metal wire layers comprises a first wire and a second wire with an interlayer insulating layer being sandwiched therebetween,
said first wire being electrically connected to a voltage source,
said second ware being grounded, further comprising at least one of first to fourth pads in said pad area,
said first pad being electrically connected to an input/output device,
said second pad being electrically connected to said first wire,
said third pad being electrically connected to said second wire,
said fourth pad being not electrically connected to said input/output device, said first wire and said second wire.

6. A semiconductor device having a plurality of wiring layers in a multi-layered structure,
said semiconductor device including an inner area at a surface, an input/output area surrounding said inner area therein, and a pad area surrounding said input/output area therein, said semiconductor device including a plurality of input/output terminals in said input/output area, and a plurality of pads in said pad area, said semiconductor device including (a) a first source voltage wire being electrically connected to a voltages source and surrounding said inner area in said pad area, and (b) a first ground wire being grounded and surrounding said first source voltage wire in aid pad areas each of said pads being electrically connected to any one of said input/output terminals, said first source voltage wire, and said first ground wire, said first source voltage wire being comprised of a plurality of first metal wiring layers in a multi-layered structure, said first metal wiring layers being electrically connected to one another through via-holes formed though first interlayer insulating films sandwiched between said first metal wiring layers, said first ground wire being comprised of a plurality of second metal wiring layers in a multi-layered structure, said second motel wiring layers being electrically connected to one another through via-holes formed through said that interlayered insulating films, each of said first metal wiring layers and each of said second wiring layers formed in the same layer, vertically adjacent first and second metal wiring layers with one of said first interlayer insulating films being sandwiched therebetween, among said first said second metal wiring layers, defining a bypass capacitor.

7. The semiconductor device as set forth in claim 6, further comprising:
(c) a second source voltage wiring being electrically connected to a voltage source and surrounding said inner area in said input/output area, and
(d) a second ground wire being grounded and surrounding said second source voltage wire in said input/output area, said second source voltage wire being comprised of a plurality of third metal wiring layers in a multi-layered structure, said third metal wiring layers being electrically connected to one another through via-holes formed through second interlayer insulating films sandwiched between said third metal wiring layers, said second ground wire being comprised of a plurality of fourth metal wiring layers in a multi-layered structure, said fourth metal wiring layers being electrically connected to one another through via-holes formed through said second interlayer insulating films, each of said third metal wiring layers and each of said fourth metal wiring layers being formed in the same layer, vertically adjacent third and fourth metal wiring layers with one of said second interlayer insulating films being sandwiched therebetween, among said third and fourth metal wiring layers, defining a bypass capacitor.

8. The semiconductor device as set forth in claim 7, wherein said first source voltage wire is electrically connected to said second source voltage wire, and said first ground wire is electrically connected to said second ground wire.

9. The semiconductor device as set forth in claim 7, wherein said first source voltage wire is comprised of a first comb-shaped wire being electrically connected to a voltage source, and said first pound wire is comprised of a second comb-shaped wire being grounded, said second source voltage wire is comprised of a third comb-shaped wire being electrically connected to a voltage source, and said second ground wire is comprised of a fourth comb-shaped wire being grounds said first and second wires being arranged such that teeth of said first comb-shaped wire are located between teeth of said second comb-shaped wire in the same plane, said third and fourth wires being arranged such that teeth of said third comb-shaped wire are located between teeth of paid fourth comb-shaped wire in the same plane.

10. The semiconductor device as set forth in claim 6, wherein said first source voltage wire is electrically connected to said second source voltage wire, and said first ground wire is electrically connected to said second ground wire.

11. The semiconductor device as set forth in claim 6, further comprising a protection device fabricated below said bypass capacitor, said protection device comprising:
(a) a substrate formed at a surface with a first well having a first electrical conductivity and a second well having a second electrical conductivity;
(b) a first interlayer insulating film formed on said substrate;
(c) a first layer formed on said first interlayer insulating film;
(d) a second interlayer insulating film formed on said frat layer; and
(e) a signal wiring layer formed on said second interlayer insulating film, said first layer including one of said first metal wiring layers, one of said second metal wiring layers, and a second signal wiring layer all electrically connected to said first or second well through via-holes formed through said fist interlayer insulating film, said second signal wiring layer being electrically connected to said signal wiring layer through via-holes formed through said second interlayer insulating film.

12. The semiconductor device as set forth in claim 6, wherein said input/output area has an extended portion located below said pad area, said extended portion comprising:
(a) a substrate formed at a surface with a first well having a first electrical conductivity and a second well having a second electrical conductivity;
(b) a first interlayer insulating film formed on said substrate;
(c) a first layered formed on said first interlayer insulating film;
(d) a second interlayer insulating film formed on said first layer; and
(e) a signal wiring layer formed on second interlayer insulating film, said first layer including one of said first metal wiring layer electrically connected to said first well through a via-holes formed though said first interlayer insulating film, one of said second metal wiring layers electrically connected to said second well through a via-hole formed through said first interlayer insulating film, and a second signal wiring layer electrically connected to said first or second well through via-holes formed through said first interlayer insulating film, said second signal wiring layer being electrically connected to said signal wiring layer through via-holes formed through said second interlayer insulating film.

13. A semiconductor device having a plurality of wiring layers in a multi-layered structure, said semiconductor device including an inner area at a surface, an input/output area surrounding said inner area therein, and a pad area surrounding said input/output area therein, said semiconductor device including a plurality of input/output terminals in said input/output area, and a plurality of pads in said pad area, said semiconductor device including (a) a first source voltage wire being electrically connected to a voltage source and surrounding said inner area in said pad area, and (b) a first ground wire being grounded and surrounding said first source voltage wire in said pad area, each of said pads being electrically connected to any one of said input/output terminals, said first source voltage wire, and said first ground wire, said semiconductor device including a protection device fabricated below said pad area, said protection device comprising:
    (a) a substrate formed at a surface with a first, well having a first electrical conductivity and a second well having a second electrical conductivity;
    (b) a first interlayer insulating film formed on said substrate;
    (c) a first layer formed on said first interlayer insulating film;
    (d) a second interlayer insulating film formed on said first layer; and
    (e) a signal wiring layer formed on second interlayer insulating film, said first layer including a first metal wiring layer, a second metal wiring layer, and a second signal wiring layer all electrically connected to said first or second well through via-holes formed through said first interlayer insulating film, said second signal wiring layer being electrically connected to said signal wiring layer through via-holes formed through said second interlayer insulating film.

14. A semiconductor device having a plurality of wiring layers in a multi-layered structure, said semiconductor device including an inner area at a surface, an input/output area surrounding said inner area therein, and a pad area surrounding said input/output area therein, said semiconductor device including a plurality of input/output terminals in said input/output area, and a plurality of pads in said pad area, said semiconductor device including (a) a first source voltage wire being electrically connected to a voltage source and surrounding said inner area in said pad area, and (b) a first ground wire being grounded and surrounding said first source voltage wire in said pad area, each of said pads being electrically connected to any one of said input/output terminals, said first source voltage wire, and said first ground wire, said input/output arcs having an extended portion located below said pad area, said extended portion comprising:
    (a) a substrate formed at a surface with a first well having a first electrical conductivity and a second well having a second electrical conductivity;
    (b) a first interlayer insulating film formed on said substrate;
    (c) a first layer formed on said first interlayer insulating film;
    (d) a second interlayer insulating film formed on said first layer; and
    (e) a signal wiring layer formed on second interlayer insulating film, said first layer including a first metal wiring layer electrically connected to said first well through a via-hole formed through said first interlayer insulating film, a second metal wiring layer electrically connected to said second well through a via-hole formed through said first interlayer insulating film, and a second signal wiring layer electrically connected to said first or second well through via-holes formed through said first interlayer insulating film, said second signal wiring layer being electrically connected to said signal wiring layer through via-holes formed through said second interlayer insulating film.

* * * * *